(12) United States Patent
Farnworth et al.

(10) Patent No.: US 6,368,896 B2
(45) Date of Patent: *Apr. 9, 2002

(54) METHOD OF WAFER LEVEL CHIP SCALE PACKAGING

(75) Inventors: Warren M. Farnworth, Nampa; Alan G. Wood, Boise; Mike Brooks, Caldwell, all of ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/298,514

(22) Filed: Apr. 23, 1999

Related U.S. Application Data

(62) Division of application No. 08/961,881, filed on Oct. 31, 1997, now Pat. No. 6,097,087.

(51) Int. Cl.$^7$ .......................... H01L 21/44; H01L 21/48; H01L 21/50
(52) U.S. Cl. ......................................... 438/113; 438/119
(58) Field of Search ................................ 438/106, 119, 438/113, 110, 108, 114, 125, 126, 464, 465, 118

(56) References Cited

U.S. PATENT DOCUMENTS

| | | | |
|---|---|---|---|
| 5,072,283 A | * 12/1991 | Bolger | |
| 5,155,302 A | 10/1992 | Nguyen | 174/88 R |
| 5,206,585 A | 4/1993 | Chang et al. | 324/158 P |
| 5,434,357 A | 7/1995 | Belcher et al. | |
| 5,440,240 A | 8/1995 | Wood et al. | 324/765 |
| 5,477,160 A | 12/1995 | Love | 324/755 |
| 5,593,927 A | 1/1997 | Farnworth et al. | |

(List continued on next page.)

OTHER PUBLICATIONS

Aschenbrenner et al., "Adhesive Flip Chip Bonding on Flexible Substrates", Oct. 26–30, 1997, Polymeric Electronics Packaging, 1997. Proceedings., The First IEEE International Symposium on, pp. 86–94.*

(List continued on next page.)

Primary Examiner—Keith Christianson
Assistant Examiner—Evan Pert
(74) Attorney, Agent, or Firm—Stephen A. Gratton

(57) ABSTRACT

A chip scale semiconductor package and a method for fabricating the package are provided. The package includes a semiconductor die and a flex circuit bonded to the face of the die. The flex circuit includes a polymer substrate with a dense array of external contacts, and a pattern of conductors in electrical communication with the external contacts. The package also includes interconnects configured to provide separate electrical paths between die contacts (e.g., bond pads), and the conductors on the flex circuit. Several different embodiments of interconnects are provided including: bumps on the die contacts, bonded to the flex circuit conductors with a conductive adhesive layer; polymer bumps on the conductors, or die contacts, applied in a semi-cured state and then fully cured; solder bumps on the die contacts and conductors, bonded to one another using a bonding tool; rivet-like bonded connections between the conductors and die contacts, formed using metal bumps and a wire bonding or ball bonding apparatus; single point bonded connections between the conductors and die contacts, formed with a bonding tool; and wire bonds between the conductors and die contacts.

17 Claims, 4 Drawing Sheets

U.S. PATENT DOCUMENTS

| | | | |
|---|---|---|---|
| 5,674,785 A | | 10/1997 | Akram et al. |
| 5,678,301 A | | 10/1997 | Gochnour et al. ............. 29/827 |
| 5,739,585 A | | 4/1998 | Akram et al. ................ 257/698 |
| 5,770,889 A | | 6/1998 | Rostoker et al. |
| 5,773,322 A | | 6/1998 | Weld ........................... 438/117 |
| 5,783,865 A | | 7/1998 | Higashiguichi et al. |
| 5,789,278 A | | 8/1998 | Akram et al. ................ 438/119 |
| 5,879,761 A | * | 3/1999 | Kulesza et al. |
| 5,889,326 A | * | 3/1999 | Tanaka |
| 5,892,271 A | * | 4/1999 | Takeda et al. |
| 5,910,641 A | * | 6/1999 | Gaynes et al. |
| 5,915,755 A | | 6/1999 | Gochnour et al. |
| 6,001,724 A | | 12/1999 | Stansbury |
| 6,002,180 A | | 12/1999 | Akram et al. |
| 6,013,948 A | | 1/2000 | Akram et al. |
| 6,020,220 A | * | 2/2000 | Gilleo et al. |
| 6,097,087 A | | 8/2000 | Farnworth et al. |
| 6,107,122 A | | 8/2000 | Wood et al. |

OTHER PUBLICATIONS

Kallmayer et al., "A Low Cost Approach to CSP Based on Meniscus Bumping, Laser Bonding Through Flex and Laser Solders Ball Placement", Oct. 8–10, 1997, Electronic Packaging Technology Conference, 1997. Proceedings of the 1997 1st, pp. 34–40.*

Kloeser et al., "Approaches to Flip Chip Technology Using Electroless Nickel–Gold Bumps", Dec. 4–6, 1995, Electronic Manufacturing Technology Symposium, 1995, Proceedings of 1995 Japan International, 18th IEEE/CPMT International, pp. 60–66.*

"Solder Bump Formation on VIA Holes", IBM Technical Disclosure Bulletin, vol. 37, No. 06B, Jun. 1994, p. 299.

High–Density, Low Temperature Solder Reflow Bonding of Silicon Chips to Plastic Substrates, IBM Technical Disclosure Bulletin, vol. 18, No. 10, Mar. 1976, p. 3477.

"An Innovative Solution For Solder Application Solder Ball Bumper (SBB)", Pac–Tech brochure, 1997.

P. Kasulke et al., "Solder Ball Bumper (SBB)—A Flexible Equipment for FC, CSP, BGA and Printed Circuit Boards", technical article, Pac Tech—Packaging Technolgies GmbH, 1996.

Chip Scale Review, May 1997, vol. 1, No. 1.

* cited by examiner

METHOD OF WAFER LEVEL CHIP SCALE PACKAGING

CROSS REFERENCE TO RELATED APPLICATIONS

This application is a division of patent application Ser. No. 08/961,881 filed Oct. 31, 1997 U.S. Pat. No. 6,097,087.

FIELD OF THE INVENTION

This invention relates generally to semiconductor packaging. More particularly, this invention relates to a chip scale semiconductor package that includes a flex circuit bonded to a semiconductor die, and interconnects electrically connecting contacts on the die to external contacts on the flex circuit.

BACKGROUND OF THE INVENTION

One type of semiconductor package is referred to as a "chip scale package". Chip scale packages are also referred to as "chip size packages", and the dice are referred to as being "minimally packaged". Chip scale packages can be fabricated in "uncased" or "cased" configurations. Uncased chip scale packages have a "footprint" (peripheral outline) that is about the same as an unpackaged die. Cased chip scale packages have a peripheral outline that is slightly larger that an unpackaged die. For example, a footprint for a typical cased chip scale package can be about 1.2 times the size of the die contained within the package.

Typically, a chip scale package includes a substrate bonded to the face of the die. The substrate includes the external contacts for making outside electrical connections to the chip scale package. The substrate for a chip scale package can comprise a flexible material, such as a polymer tape, or a rigid material, such as silicon, ceramic, glass or FR-4. The external contacts for one type of chip scale package include solder balls arranged in a dense array, such as a ball grid array (BGA), or a fine ball grid array (FBGA). These dense arrays permit a high input/output capability for the chip scale package. For example, a FBGA on a chip scale package can include several hundred solder balls.

One aspect of chip scale packages is that the dense arrays of external contacts are difficult to fabricate. In particular, reliable electrical interconnections must be made between the external contacts for the package, and contacts on the die contained within the package. Typically, the contacts on the die are thin film aluminum bond pads in electrical communication with integrated circuits on the die.

FIG. 1 illustrates a prior art chip scale package 10. The package 10 includes: a semiconductor die 12; a polymer tape 14 bonded to a face of the die 12; and an encapsulant 16 bonded to the face and sides of the die 12. In addition, the package 10 includes an adhesive layer 18 for bonding the polymer tape 14 to the die 12, and a dense array of solder balls 20 formed on the polymer tape 14. Metal beams 22 are bonded to the solder balls 20, and to device bond pads 24 on the die 12. The metal beams 22 are also encapsulated in the encapsulant 16.

A representative process flow for forming the chip scale package 10 includes bonding one or more dice 10 to a strip of the polymer tape 14. The metal beams 22 can then be bonded to the device bond pads 24. Next, the encapsulant 16 can be formed, and the solder balls 20 attached to the metal beams 22. The individual packages 10 can then be singulated from the strip of polymer tape 14 and tested.

Typically, a thermosonic bonding process using gold or gold plated materials are employed to bond the metal beams 22. In addition, specialized bonding tools are required to make the bonds between the metal beams 22 and the bond pads 24. The metal beams 22 are also subjected to stresses from the bonding and encapsulation processes, and during subsequent use of the package 10. These stresses can cause the bonds to weaken or pull apart.

The present invention is directed to an improved chip scale semiconductor package including dense array external contacts, and improved interconnects between the external contacts and contacts on the die.

SUMMARY OF THE INVENTION

In accordance with the present invention, an improved chip scale package, and a method for fabricating the package are provided. The package comprises a singulated semiconductor die, and a flex circuit bonded to a face of the die in electrical communication with die contacts (e.g., device bond pads). The flex circuit includes a polymer substrate on which external contacts, such as an array of solder bumps (e.g., BGA, FBGA), are formed. The flex circuit also includes conductors on the polymer substrate, in electrical communication with the external contacts.

In addition to the die and flex circuit, the package includes interconnects electrically connecting the die contacts to the flex circuit conductors. A wafer level fabrication process can be used to bond the flex circuit and form the interconnects. Singulation of the wafer forms the individual packages.

In a first embodiment, the interconnects comprise solder bumps on the die contacts, and a conductive polymer layer which forms separate electrical paths between the solder bumps and the flex circuit conductors. Suitable materials for forming the conductive polymer layer include z-axis anisotropic adhesives, and z-axis epoxies applied as a viscous paste, and then cured under compression.

In a second embodiment, the interconnects comprise conductive polymer bumps on the die contacts, which are bonded to the flex circuit conductors. Suitable materials for forming the polymer bumps include isotropic adhesives that are conductive in any direction (e.g., silver filled silicone), and anisotropic adhesives that are conductive in only one direction (z-axis epoxies). In addition, an electrically insulating adhesive layer, such as silicone, can be used to bond the flex circuit to the die, and to absorb thermal stresses. Furthermore, the polymer bumps can be applied to the die contacts in a semi-cured, or B-stage condition, and then fully cured while in physical contact with the die contacts. For semi-cured polymer bumps, a compliant elastomeric base material can include dendritic metal particles for penetrating oxide layers on the die contacts, and a solvent to permit partial curing at room temperature.

In a third embodiment, the interconnects comprise solder bumps on the die contacts, bonded to solder bumps on the flex circuit conductors. A compliant layer can also be formed between the die and flex circuit to absorb thermal stresses. Bonding of the solder bumps can be with thermocompression bonding, thermosonic bonding, or ultrasonic bonding.

In a fourth embodiment, the interconnects comprise solder bumps on the flex circuit conductors, and polymer bumps on the die contacts.

In a fifth embodiment, the interconnects comprise solder bumps on the die contacts, bonded to plated metal bumps on the flex circuit conductors. A compliant layer can also be formed between the flex circuit and die, as an adhesive and thermal expansion joint. Suitable materials for the plated metal bumps include gold, palladium and gold plated metals.

In a sixth embodiment, the interconnects comprise rivet-like, bonded connections between the die contacts and the flex circuit conductors. The bonded connections include a first set of metal bumps on the die contacts, and a second set of metal bumps formed through openings in the conductors and bonded to the first set of metal bumps. Both sets of metal bumps can be formed using a bonding tool of a wire bonding apparatus. Alternately, the metal bumps can be formed using a solder ball bumper apparatus configured to place and reflow a first set of pre-formed solder balls on the die contacts, and then to place and reflow a second set of pre-formed solder balls through the openings in the flex circuit conductors onto the first set.

In a seventh embodiment, the interconnects comprise bonded connections between the flex circuit conductors and the die contacts formed using thermocompression bonding, thermosonic bonding, or a laser pulse. In this embodiment the polymer substrate can include openings which provide access for a bonding tool to portions of the flex circuit conductors. Using the openings the tool presses and bonds the portions to the die contacts. In addition, adhesive dots can be formed between the flex circuit substrate, and the die to align and attach the flex circuit to the die. The die contacts can also include an electrolessly plated metal to facilitate formation of the bonded connections.

In an eight embodiment, the interconnects comprise compliant polymer bumps on the die contacts, and a conductive polymer layer which electrically connects the polymer bumps to the flex circuit conductors.

In a ninth embodiment, the interconnects comprise plated metal bumps on the flex circuit conductors, and a conductive polymer layer which electrically connects the plated metal bumps to the die contacts.

In a tenth embodiment, the interconnects comprise wire bonds formed between the die contacts and the flex circuit conductors. In this embodiment the flex circuit substrate includes openings for the wire bonds.

DETAILED DESCRIPTION OF THE PREFERRED EMBODIMENTS

Figure 1:
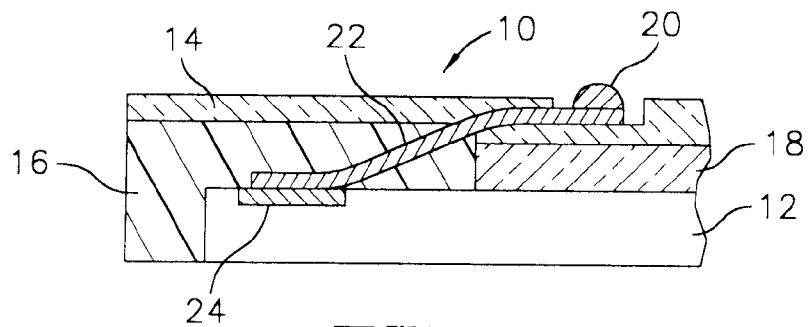
FIG. 1 is an enlarged schematic cross sectional view of a prior art chip scale package.
Figure 2A:
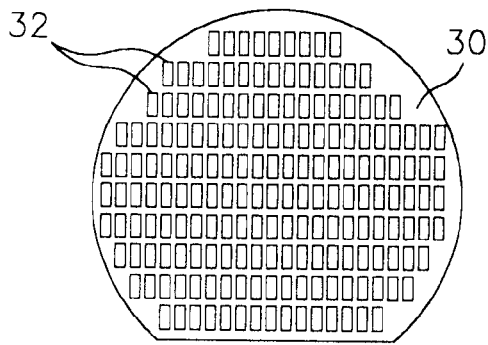
FIG. 2A is a schematic plan view of a semiconductor wafer during a wafer level process for fabricating chip scale packages in accordance with the invention.
Figure 2B:
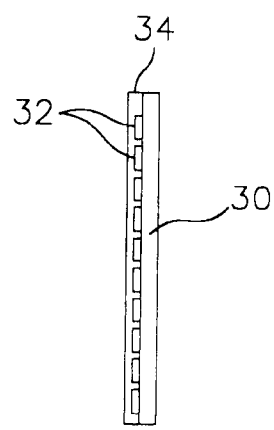
FIG. 2B is a schematic side elevation view of the wafer of FIG. 2A following attachment of a flex circuit thereto.

Referring to FIGS. 2A–2B, steps in a wafer level process for fabricating chip scale semiconductor packages in accordance with the invention are illustrated. Initially, as shown in FIG. 2A, a semiconductor wafer 30 can be provided. The wafer 30 includes multiple semiconductor dice 32. Each die 32 has a desired size and peripheral shape (e.g., rectangular, square). In addition, each die 32 includes integrated circuits in a desired configuration. Still further, each die 32 includes die contacts 48 (FIG. 4) in electrical communication with the integrated circuits. The die contacts 48 (FIG. 4) can be conventional thin film aluminum bond pads formed on the face of the die.

As shown in FIG. 2B, a sheet of flex circuit 34 can be bonded to a face (circuit side) of the wafer 30. The flex circuit 34 comprises a multi layered sheet of material similar to TAB tape, such as "ASMAT" manufactured by Nitto Denko. The flex circuit 34 can be formed separately, and then bonded to the wafer 30. Bonding of the flex circuit 34 to the wafer 30 will be more fully described as the description proceeds. Following bonding of the flex circuit 34 to the wafer 30, the dice 32 can be singulated by saw cutting, or shearing the wafer 30, to form individual chip scale packages 42 (FIG. 3).

Figure 3:
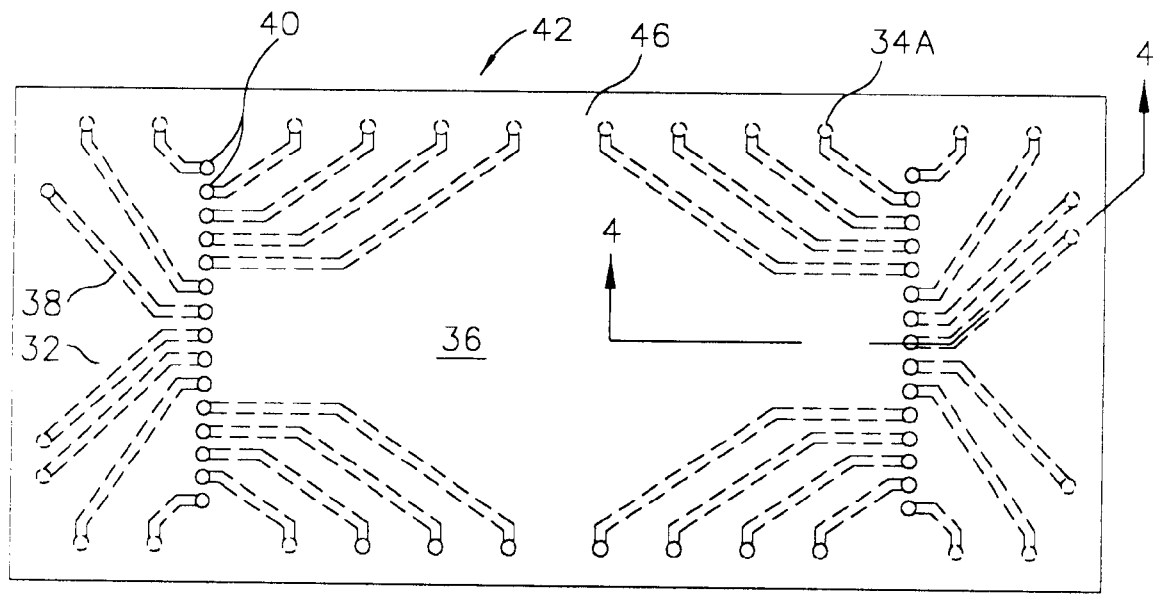
FIG. 3 is a schematic plan view of a semiconductor package constructed in accordance with the invention.

As shown in FIG. 3, each chip scale package 42 includes a singulated die 32 and a singulated portion of flex circuit 34A. The package 42 and flex circuit 34A have a peripheral outline substantially similar to that of the die 32. The flex circuit 34A includes a polymer substrate 36, which comprises an electrically insulating, flexible material. Suitable materials for the polymer substrate 36 include polyimide, polyester, epoxy, urethane, polystyrene, silicone and polycarbonate. A representative thickness for the polymer substrate 36 can be from about 25 to 400 µm.

Figure 4:
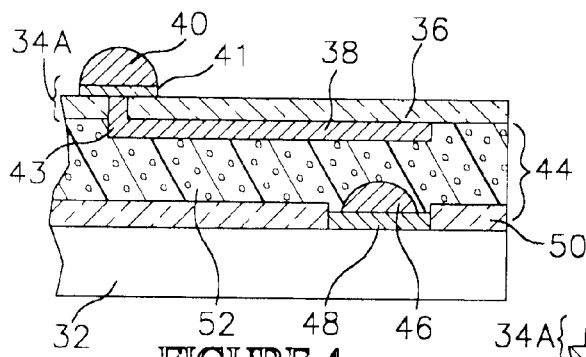
FIG. 4 is an enlarged schematic cross sectional view taken along section line 4—4 of FIG. 3 illustrating an interconnect for the package of FIG. 3.

The flex circuit 34A also includes an array of external contacts 40 formed on a first side of the polymer substrate 36. In the illustrative embodiment the external contacts 40 comprise metal balls on a land pad 41 (FIG. 4). For example, each external contact 40 can be generally hemispherical, convex, or dome-shaped, with an outside diameter "D" and a height of "H". Representative size ranges for the diameter "D" and height "H" can be from about 2.5 mils to 30 mils. A pitch and density of the external contacts 40 can be selected as required. For example, the external contacts 40 can be arranged in a dense array, such as a ball grid array (BGA), or fine ball grid array (FBGA). For simplicity in FIG. 3, the external contacts 40 are illustrated in an array of two rows. However, some dense arrays can cover the entire face of the chip scale package 42 and include hundreds of external contacts 40.

The external contacts 40 can comprise a solder alloy such as 95%Pb/5%Sn, 60%Pb/40%Sn, 63%In/37%Sn, or 62%Pb/36%Sn/2%Ag. For example, the external contacts 40 can comprise pre-fabricated solder balls bonded to solder wettable land pads 41. Suitable pre-fabricated solder balls are manufactured by Mitsui Comtek Corp. of Saratoga, Calif. under the trademark "SENJU SPARKLE BALLS". A solder ball bumper can be used to bond the solder balls to the land pads 41 (FIG. 4). A suitable solder ball bumper is manufactured by Pac Tech Packaging Technologies of Falkensee, Germany.

Alternately, the external contacts 40 can be formed using an electro-deposition or electroless deposition process to deposit land pads and balls of desired materials. As another alternative, the external contacts 40 can be formed using electroless deposition and wave soldering as described in U.S. patent application Ser. No. 08/905,870, entitled "Method And System For Fabricating Solder Bumps On Semiconductor Components", incorporated herein by reference. Still further, the external contacts 40 can comprise a conductive polymer material, such as metal filled epoxy bumps formed by a stencil printing process.

The land pads 41 (FIG. 4) for the external contacts 40 comprise a metal selected to provide adhesion and a diffusion barrier. Suitable metals for the land pads 41 include nickel, zinc, chromium and palladium. The land pads 41 (FIG. 4) can be formed using an electro-deposition or electroless deposition as previously described for the external contacts 40. The land pads 41 (FIG. 4) can also be formed by blanket depositing a metal layer, then photo-patterning and etching the metal layer. Metal filled vias 43 (FIG. 4) in the polymer substrate 36 electrically connect the land pads 41 to the flex circuit conductors 38. The metal filled vias 43 can also be formed using an electro-deposition or electroless deposition process.

As shown in FIG. 3, the flex circuit 34A also includes a pattern of conductors 38 formed on a second side of the polymer substrate 36, in electrical communication with the external contacts 40. The conductors 38 can be formed on the polymer substrate 36 prior to formation of the external contacts 40. For example, a metallic layer can be blanket deposited on the polymer substrate 36, such as by electrodeposition, and then patterned and etched to form the conductors 38. Preferably, the conductors 38 comprise a highly conductive metal, such as gold, gold plated metals, copper, plated copper, nickel or an alloy such as Ni—pd. By way of example, the conductors 38 can be formed with a thickness of from 1 $\mu$m–35 $\mu$m. In place of a deposition process, the conductors 38 can comprise a separate element, such as metal foil about 1 mil thick, bonded to the polymer substrate 36 and patterned.

Referring to FIG. 4, an interconnect 44 for the package 42 (FIG. 3) is illustrated. As used herein, the term "interconnect" refers to a component that electrically connects the packaged die 32 to the flex circuit 34A. More particularly, the interconnect 44 forms separate electrical paths between the die contacts 48 and the flex circuit conductors 38.

In the embodiment of FIG. 4, the interconnect 44 comprises solder bumps 46 on the die contacts 48, and a conductive polymer layer 52 in electrical communication with the solder bumps 46 and flex circuit conductors 38. Suitable materials for forming the conductive polymer layer 52 include z-axis anisotropic adhesives, and z-axis epoxies. In general, a z-axis anisotropic adhesive provides conductivity in the z-direction, and electrical isolation in the x and y directions. The conductive polymer layer 52 thus functions to provide separate electrical paths between the solder bumps 46 and flex circuit conductors 38.

The z-axis anisotropic adhesives can be provided in either a thermal plastic configuration or a thermal setting configuration. Thermal plastic conductive elastomers are heated to soften for use and then cooled under compression for curing. Thermal setting conductive elastomers are viscous at room temperature, but require heat curing under compression at temperatures from 100–300° C. for from several minutes to an hour or more. Suitable z-axis anisotropic adhesives include "Z-POXY", by A.I. Technology, Trenton, N.J., and "SHELL-ZAC", by Sheldahl, Northfield, Minn.

The solder bumps 46 on the die 32 comprise a solder material as previously described for external contacts 40. The solder bumps 46 can also include underlying layers (not shown) on the die contacts 48 to provide adhesion and diffusion barriers. In addition, a passivation layer 50 on the die 32 electrically isolates the solder bumps 46 and die contacts 48. The solder bumps 46 can be fabricated using a deposition process as previously described, or using electroless deposition and wave soldering as described in previously incorporated U.S. patent application Ser. No. 08/905,870.

Figure 5:
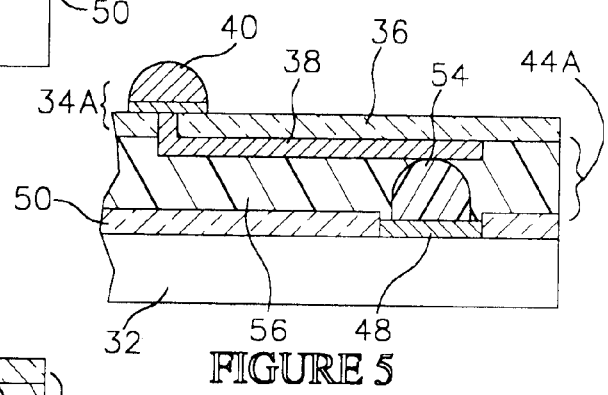
FIG. 5 is an enlarged schematic cross sectional view equivalent to FIG. 4 of an alternate embodiment interconnect.

Referring to FIG. 5, an alternate embodiment interconnect 44A comprises polymer bumps 54 on the die contacts 48, and an electrically insulating adhesive layer 56 formed between the die 32 and flex circuit 34A. The polymer bumps 54 can comprise an anisotropic adhesive as previously described, or an isotropic conductive adhesive (i.e., conductive in all directions). Suitable methods for forming the polymer bumps 54 include screen printing through a stencil, and dot shooting through a nozzle. Suitable materials for forming the polymer bumps 54 include the anisotropic adhesives previously described and isotropic adhesives, such as silver filled silicone. The polymer bumps 54 can be deposited on the die contacts 48 in a viscous condition and then cured under compression.

After formation on the die contacts 48, the polymer bumps 54 can be aligned with the flex circuit conductors 38 and placed in contact therewith. Alignment can be accomplished with a split optics system such as one used in an aligner bonder tool, or using an alignment fence or jig. Full curing under compression physically bonds the polymer bumps 54 to the flex circuit conductors 38 in electrical communication therewith. Full curing can be accomplished using an oven maintained at a temperature of between 150° C. to 300° C. for from several minutes to an hour.

Alternately, the polymer bumps 54 can be deposited in a semi-cured, or B-stage condition and then fully cured after contact with the flex circuit conductors 38. In this case the polymer bumps 54 can be formulated with dendritic conductive particles in an adhesive base (e.g., silicone). One suitable formula includes silver particles and a phthalate-acetate hydroxyl copolymer. The adhesive base can also include a solvent to allow semi-curing of the material at room temperature, and full curing at higher temperatures (e.g., 150° C.). In a semi-cured condition the polymer bumps 54 have a stable configuration that provides electrical paths through the material. The semi-cured condition also permits conductive particles to penetrate oxide layers on the flex circuit conductors 38 without the necessity of compression loading the material during the curing process.

The adhesive layer 56, in addition to providing electrical insulation, also physically attaches the flex circuit 34A to the die 32 and provides a compliant layer. One suitable electrically insulating adhesive layer 56 is "ZYMET" silicone elastomer manufactured by Zymet, Inc., East Hanover, N.J. The adhesive layer 56 can also comprise an instant curing elastomer such as a cyanoacrylate adhesive, or an anaerobic acrylic adhesive. Suitable cyanoacrylate adhesives are commercially available from Loctite Corporation, Rocky Hill, Conn. under the trademarks "410" or "416".

Figure 6:
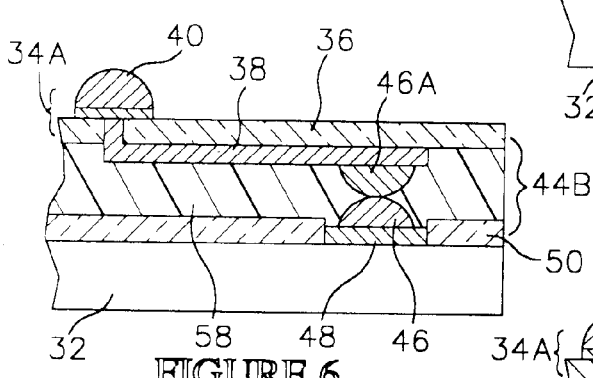
FIG. 6 is an enlarged schematic cross sectional view equivalent to FIG. 4 of an alternate embodiment interconnect.

Referring to FIG. 6, an alternate embodiment interconnect 44B comprises solder bumps 46 on the die contacts 48, bonded to solder bumps 46A on the flex circuit conductors 38. The solder bumps 46 and 46A can be formed using the solders and methods previously described. Bonding of the solder bumps 46 and 46A can be accomplished with heat and pressure using a gang bonding thermode.

In addition, a compliant layer 58 can be formed between the flex circuit 34A and die 32. In this case the main purpose of the compliant layer 58 is as a thermal expansion joint to compensate for any CTE mismatch between the flex circuit 34A and die 32. The compliant layer 58 can be formed in the gap between the flex circuit 34A and die 32 using a suitable dispensing method. Suitable dispensing methods include spin-on, stenciling and drawing a material into the gap by capillary action. Also the compliant layer 58 can be formed prior to formation of the solder bumps 46 on the die 32 and patterned with openings for the solder bumps 46. One suitable material for the compliant layer is "HYSOL BRAND FP4520" sold by Dexter Electronic Materials. Alternately, the compliant layer 58 can be omitted.

Figure 7:
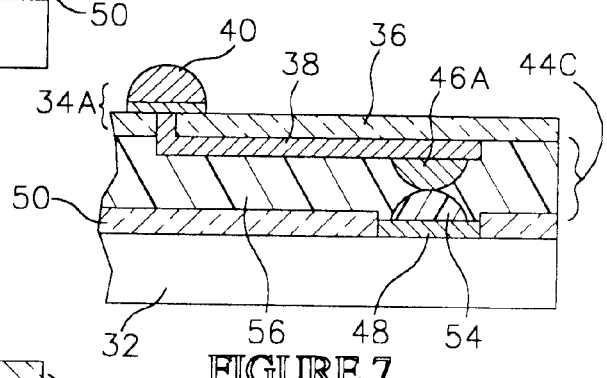
FIG. 7 is an enlarged schematic cross sectional view equivalent to FIG. 4 of an alternate embodiment interconnect.

Referring to FIG. 7, an alternate embodiment interconnect 44C comprises polymer bumps 54 on the die contacts 48, bonded to solder bumps 46A on the flex circuit conductors 38. The polymer bumps 54 can be formed as previously described by depositing an uncured conductive polymer and curing under compression as previously described. The polymer bumps 54 can also be fabricated in a semi-cured, or B-stage condition as previously described. In addition, an adhesive layer 56 can be formed as previously described.

Figure 8:
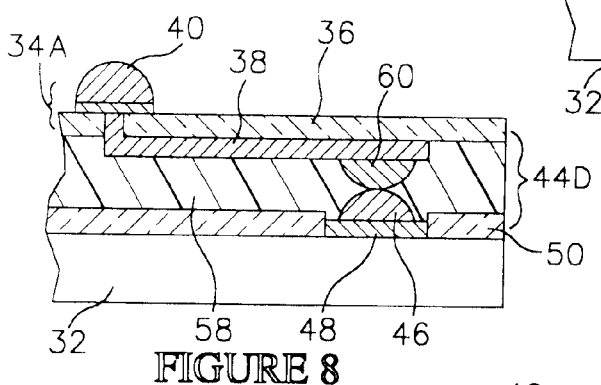
FIG. 8 is an enlarged schematic cross sectional view equivalent to FIG. 4 of an alternate embodiment interconnect.

Referring to FIG. 8, an alternate embodiment interconnect 44D comprises solder bumps 46 on the die contacts 48, bonded to plated metal bumps 60 on the flex circuit conductors 38. The solder bumps 46 can be formed as previously described. The plated metal bumps 60 can also be formed substantially as previously described, but using a gold or gold plated metal. Bonding the plated metal bumps 60 to the solder bumps 46 can be using a gang bonding thermode as previously described. In addition, a compliant layer 58 can be formed or alternately omitted as previously described.

Figures 9A, 9B:
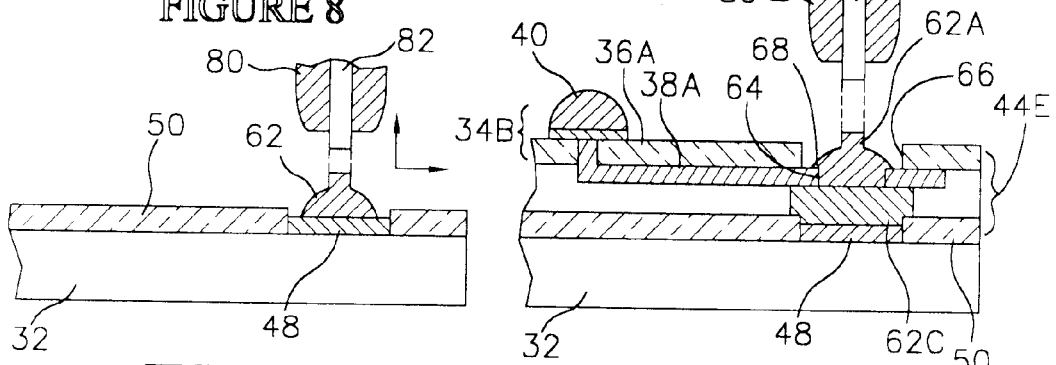
FIGS. 9A and 9B are enlarged schematic cross sectional views equivalent to FIG. 4 of an alternate embodiment interconnect during fabrication using a bonding tool of a wire bonder apparatus.

Referring to FIGS. 9A and 9B, an alternate embodiment riveted interconnect 44E (FIG. 9B) is shown. Initially, as shown in FIG. 9A, first metal bumps 62 can be formed on the die contacts 48. The metal bumps 62 can be formed using a conventional wire bonding apparatus configured for thermocompression bonding (T/C), thermosonic bonding (T/S), or wedge bonding (W/B) of a metal wire 82. The wire bonding apparatus can include a bonding tool 80 adapted to manipulate the metal wire 82. Suitable wire materials for forming the metal bump 62 include gold, palladium, silver and solder alloys.

As shown in FIG. 9B, in this embodiment the flex circuit 34B includes conductors 38A with openings 64. In addition, a polymer substrate 36A of the flex circuit 34C includes openings 66 aligned with the openings 64 in conductors 38A. The openings 64 and 66 provide access for forming second metal bumps 62A (FIG. 9B) on the first metal bumps 62 (FIG. 9A). The second metal bumps 62A can also be formed using the bonding tool 80. The second metal bumps 62A (FIG. 9B) compress the first metal bumps 62 (FIG. 9A) to form compressed metal bumps 62C (FIG. 9B).

During formation of the second metal bumps 62A (FIG. 9B) annular shoulders 68 (FIG. 9B) can form around the outer peripheral edges of the openings 64 in the flex circuit conductor 38A. The annular shoulders 68 comprises portions of the second metal bumps 62A which are compressed against the flex circuit conductors 38A. In this configuration, the second metal bumps 62A form bonded connections between the flex circuit conductors 38A and the compressed metal bumps 62C, which are similar to metal rivets. The bonded connections physically attach the flex circuit 34A to the die 32. In addition, the bonded connections form separate electrical paths between the die contacts 48 and the flex circuit conductors 38A. An additional compliant layer (not shown) equivalent to the compliant layer 58 (FIG. 6) previously described may also be employed to provide compliancy and accommodate thermal expansion. However, with no compliant layer, the flex circuit 34B is free floating in areas between adjacent metal bumps 62A. Accordingly, differences in thermal expansion between the flex circuit 34B and the die 32 can be absorbed by movement of the flex circuit 34A.

Figure 9C:
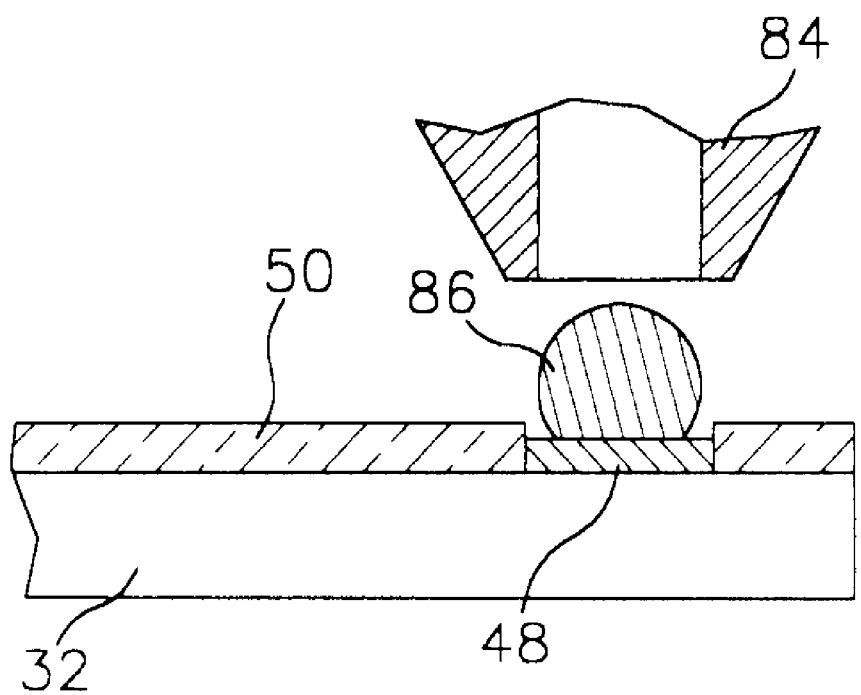
FIGS. 9C and 9D are enlarged schematic cross sectional views equivalent to FIGS. 9A and 9B of an alternate embodiment interconnect during fabrication using a bonding tool of a solder ball bumper.
Figure 9D:
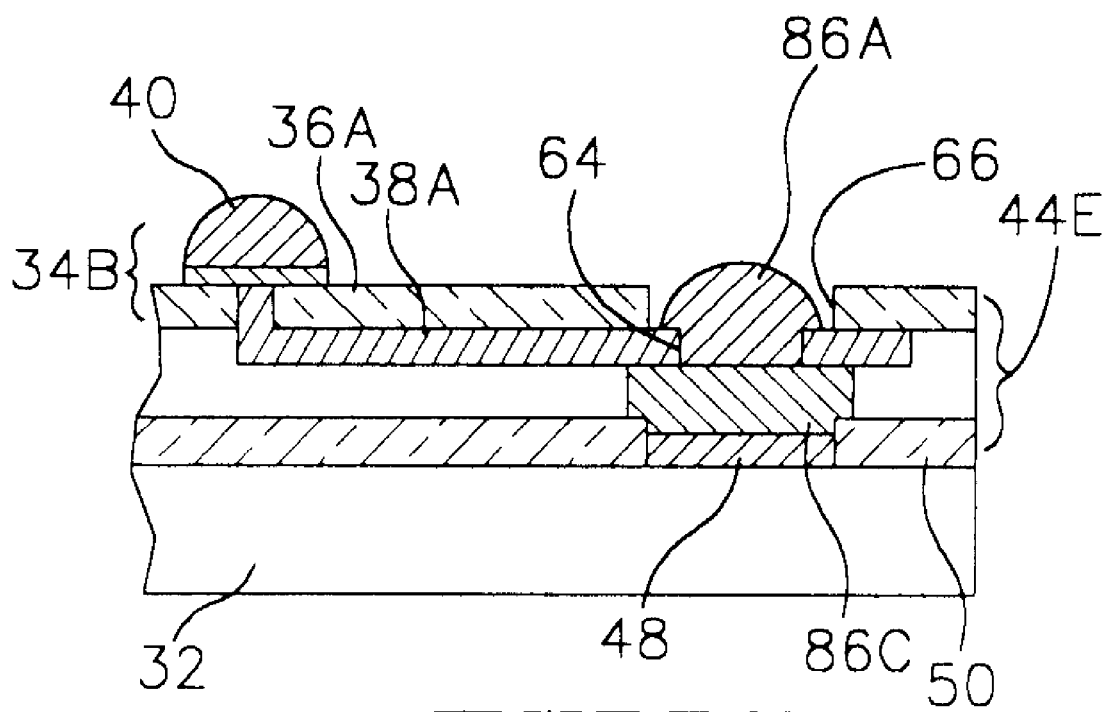

FIGS. 9C and 9D illustrate essentially the same embodiment as FIGS. 9A and 9B, interconnect 44E constructed using a solder ball bumper apparatus rather than a wire bonder. A solder ball bumper apparatus attaches pre-formed solder balls to metal pads, such as bond pads on a die or land pads on a substrate, using a reflow process. A representative solder ball bumper apparatus with a laser reflow system is manufactured by Pac Tech Packaging Technologies of Falkensee, Germany.

As shown in FIG. 9C, the ball bumper apparatus includes a bonding tool 84, which has bonded pre-formed solder balls 86 to the die contacts 48. Following bonding of the balls 86 to the die contacts 48, the flex circuit 34B can be placed on the die 32, with the openings 64 in the flex circuit conductors 38A in alignment with the bonded solder balls 86. As shown in FIG. 9D, second balls 86A can be placed on the solder balls 86, and then reflowed using the same bonding tool 84. The second reflow step also compresses the initially bonded solder balls 86 (FIG. 9C) to form compressed solder balls 86C (FIG. 9D). In addition, the sizes of the openings 64 and solder balls 86A can be selected to form bonded connections between the flex circuit conductors 38A and the compressed solder balls 86C. Additionally, a compliant layer similar to compliant layer 58 (FIG. 6) can be formed in the gap between the flex circuit 34B and die 32.

Figure 10:
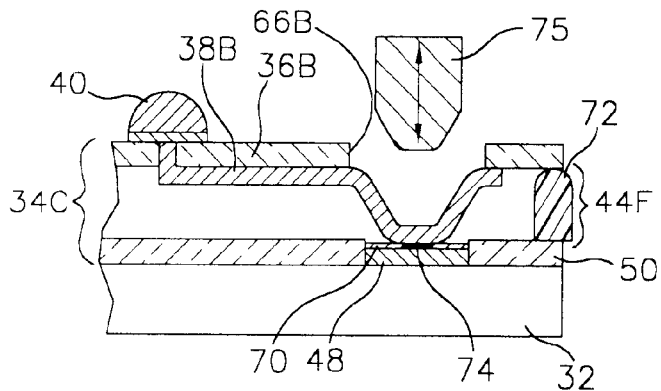
FIGS. 10A and 10 are enlarged schematic cross sectional views equivalent to FIG. 4 of an alternate embodiment interconnect during fabrication.

Referring to FIG. 10, an alternate embodiment interconnect 44F is illustrated. The interconnect 44F includes bonded connections 74 between flex circuit conductors 38B and the die contacts 48. The interconnect 44F also includes adhesive members 72 between the flex circuit 34C and die 32. The adhesive members 72 can comprise an electrically insulating adhesive such as silicone applied in a tacking configuration or as a continuous ridge.

The bonded connections 74 can be formed using a tool 75 such as a laser pulse tool, or alternately a thermocompression or thermosonic thermode. For a laser pulse tool, the tool 75 can be a component of a solder ball bumper, such as the previously described apparatus manufactured by Pac Tech. For a thermode, the tool 75 can be a component of a conventional wire bonder apparatus. Openings 66B can be provided in the polymer substrate 36B to provide access for the tool 75. In this embodiment, the flex circuit conductors 38B comprise a metal that can be bonded to the die contacts 48 using the heat generated by the tool 75. Suitable metals for the flex circuit conductors 38B include copper, gold and nickel.

Figure 10A:
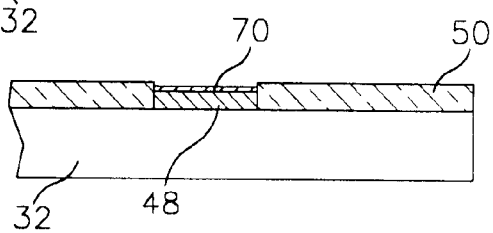

In addition, as shown in FIG. 10A, a bonding layer 70 can be electrolessly deposited on the die contacts 48 prior to formation of the bonded connections 74. The bonding layer 70 provides a metallurgy suitable for bonding to the flex circuit conductors 38B. Suitable metals for forming the bonding layer 70 include palladium, gold, tin and tin plated copper. Solutions for electrolessly plating these metals are known in the art. For example, palladium bonding layers 70 can be formed using a 1 gm/liter palladium solution comprising palladium chloride and sodium hypophosphate. A suitable palladium solution is commercially available from Lea Ronal under the trademark "PALLAMERSE Pd". A representative thickness of the bonding layer 70 can be from several hundred Å to several μm or more. The bonding layer 70 can also be formed as described in the previously incorporated U.S. patent application Ser. No. 08/905,870. Also in this embodiment, if desired, a low stress compliant layer can be formed in the gap between the flex circuit conductors 38B and the die 50. The low stress compliant layer can be formed as previously described for compliant layer 58 (FIG. 6) mainly to absorb thermal stresses between the flex circuit 34C and die 32.

Figure 11:
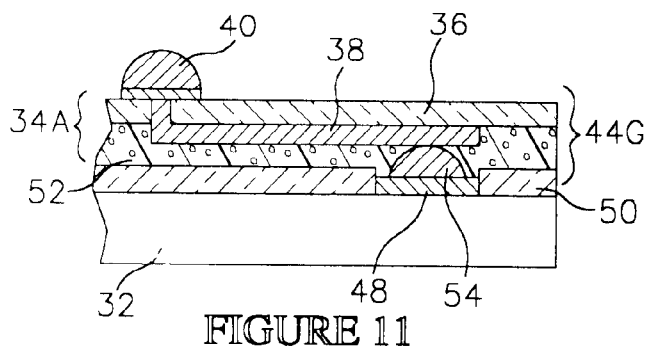
FIG. 11 is an enlarged schematic cross sectional view equivalent to FIG. 4 of an alternate embodiment interconnect.

Referring to FIG. 11, an alternate embodiment interconnect 44G includes polymer bumps 54 formed on the die contacts 48 substantially as previously described (e.g., 54-FIG. 7). In addition, the interconnect 44G includes a conductive polymer layer 52 formed substantially as previously described. Curing the polymer layer 52 under compression forms separate electrical paths between the polymer bumps 54 and the flex circuit conductors 38.

Figure 12:
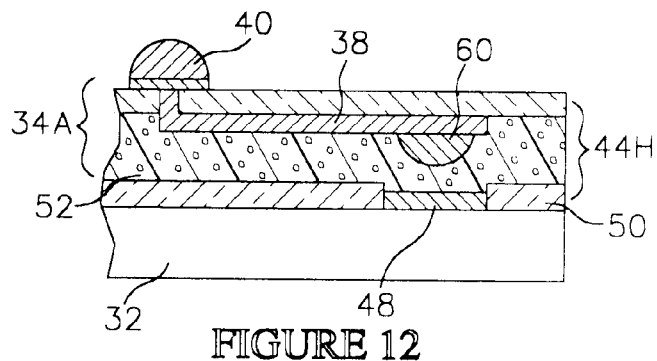
FIG. 12 is an enlarged schematic cross sectional view equivalent to FIG. 4 of an alternate embodiment interconnect.

Referring to FIG. 12, an alternate embodiment interconnect 44H includes plated metal bumps 60 on the flex circuit conductors 38, and a conductive polymer layer 52. The plated metal bumps 60 can be formed substantially as previously described (e.g., 60-FIG. 8). In addition, the conductive polymer layer 52 can be formed substantially as previously described. Curing the polymer layer 52 under compression forms separate electrical paths between the plated metal bumps 60 and the die contacts 48.

Figure 13:
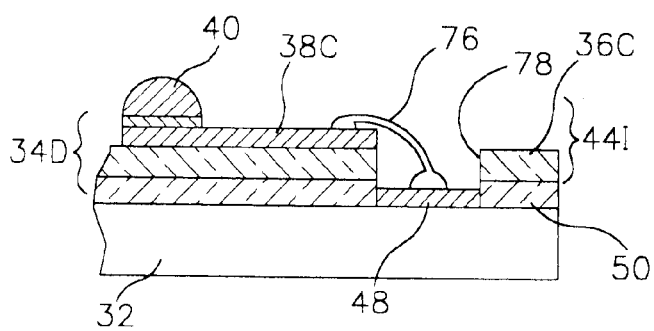
FIG. 13 is an enlarged schematic cross sectional view equivalent to FIG. 4 of an alternate embodiment interconnect.

Referring to FIG. 13, an alternate embodiment interconnect 44I includes a flex circuit 34D having a polymer substrate 36C and conductors 38C. The interconnect 44I also includes wires 76 bonded to the conductors 38C, and to the die contacts 48. In this embodiment the conductors 38C can be insulated with a suitable insulating layer (not shown). In addition, the polymer substrate 36C contacts the die passivation layer 50 to provide electrical insulation between the die 32 and flex circuit 34C. Also, the polymer substrate 36C includes openings 78 to allow access for wire bonding the wires 76. Wire bonding can be accomplished using a conventional wire bonder. Suitable materials for the wires 76 include aluminum alloys (e.g., aluminum-silicon and aluminum-magnesium) and gold. In addition, a compliant layer (not shown) can be formed between the flex circuit 34D and die 32 as previously described.

Thus the invention provides an improved semiconductor package and method of fabrication. While the invention has been described with reference to certain preferred embodiments, as will be apparent to those skilled in the art, certain changes and modifications can be made without departing from the scope of the invention as defined by the following claims.

What is claimed is:

1. A method for fabricating semiconductor packages comprising:
   providing a semiconductor wafer having a face and comprising a plurality of semiconductor dice, each die comprising a plurality of die contacts on the face, a plurality of bumps on the die contacts having a height relative to the face, and a layer on the face electrically insulating the die contacts and the bumps;
   providing a flex circuit comprising a polymer substrate having a first side and an opposing second side, a plurality of external contacts on the first side, and a plurality of conductors on the second side in electrical communication with the external contacts;
   depositing a conductive polymer material between the face of the wafer and the flex circuit, the conductive polymer material substantially covering the face of the wafer, the second side of the flex circuit, the conductors on the flex circuit and the bumps on the dice;
   curing the conductive polymer material under compression to attach the flex circuit to the dice, and form separate electrical paths between the bumps and the conductors; and
   singulating the dice from the wafer.

2. The method of claim 1 wherein the bumps comprise solder.

3. The method of claim 1 wherein the bumps comprise solder and are generally hemispherical, convex or dome-shaped.

4. The method of claim 1 wherein the height of the bumps is from about 2.5 mils to 30 mils.

5. A method for fabricating semiconductor packages comprising:
   providing a semiconductor wafer comprising a plurality of semiconductor dice, each die comprising a face and a plurality of die contacts on the face, each die contact comprising a generally hemispherical, convex or dome-shaped solder bump having a diameter and a height relative to the face;
   providing a flex circuit comprising a polymer substrate, a plurality of external contacts on a first side of the polymer substrate, and a plurality of conductors on an opposing second side of the polymer substrate in electrical communication with the external contacts;
   forming a conductive polymer layer between the flex circuit and the wafer with the conductors on the flex circuit aligned with the die contacts on the dice;
   heating and curing the conductive polymer layer under compression to bond the flex circuit to the wafer, and to provide separate electrical paths between the conductors and the die contacts; and
   singulating the dice into the packages, each package comprising a singulated die and a portion of the flex circuit bonded to the singulated die.

6. The method of claim 5 wherein the height of the bump is between about 2.5 mils to 30 mils.

7. The method of claim 5 wherein the providing the semiconductor wafer step comprises forming the solder bumps on the die contacts using a deposition process.

8. The method of claim 5 wherein the singulated die and the portion of the flex circuit have a same peripheral outline.

9. A method for fabricating semiconductor packages comprising:
   providing a semiconductor wafer comprising a face, an electrical insulating layer on the face, and a plurality of semiconductor dice comprising a plurality of die contacts on the face;

depositing a plurality of solder bumps on the die contacts having a height relative to the face with the electrical insulating layer electrically insulating the bumps;

providing a flex circuit comprising a polymer substrate, a plurality of external contacts on a first side of the polymer substrate, and a plurality of conductors on an opposing second side of the polymer substrate in electrical communication with the external contacts;

placing a conductive polymer layer in a viscous condition on the second side of the polymer substrate and on the conductors;

placing the flex circuit on the wafer with the bumps on the dice aligned with the conductors on the flex circuit;

compressing the conductive polymer layer between the face of the wafer and the polymer substrate;

heating and curing the conductive polymer layer during the compressing step to bond the flex circuit to the dice and to provide separate electrical paths between the conductors and the die contacts; and singulating the wafer into the packages, each package comprising a singulated die and a portion of the flex circuit bonded to the singulated die having a peripheral outline matching that of the singulated die.

10. The method of claim 9 wherein the solder bumps have a generally hemispherical, convex or dome shape.

11. The method of claim 9 wherein the conductive polymer layer comprises an anisotropic adhesive material.

12. The method of claim 9 further comprising forming balls on the external contacts.

13. The method of claim 9 wherein the height of the solder bumps is between about 2.5 mils to 30 mils.

14. The method of claim 9 wherein a diameter of the solder bumps is between about 2.5 mils to 30 mils.

15. A method for fabricating semiconductor chip scale packages comprising:

providing a semiconductor wafer having a face and comprising a plurality of semiconductor dice, each die comprising a plurality of die contacts on the face and a plurality of bumps on the die contacts having a height relative to the face;

providing a flex circuit comprising a polymer substrate, a plurality of external contacts on a first side of the polymer substrate, and a plurality of conductors on an opposing second side of the polymer substrate in electrical communication with the external contacts;

placing an anisotropic adhesive on the conductors and on the second side;

aligning the conductors to the bumps;

compressing and heating the anisotropic adhesive between the wafer and the polymer substrate; and singulating the wafer into the packages, each package comprising a singulated die and a portion of the flex circuit bonded to the singulated die with the anisotropic adhesive providing electrical paths between the conductors on the portion of the flex circuit, and the bumps on the singulated die, and with the singulated die and the portion of the flex circuit having substantially matching outlines.

16. The method of claim 15 wherein the bumps have a generally hemispherical, convex or dome shape.

17. The method of claim 15 wherein the bumps comprise solder.

\* \* \* \* \*